(12) United States Patent
Schmid

(10) Patent No.: US 12,385,955 B2
(45) Date of Patent: Aug. 12, 2025

(54) MEASURING APPARATUS FOR MEASURING A VOLTAGE OVER AN ISOLATION BARRIER AND HOUSEHOLD APPLIANCE HAVING THE MEAURING APPARATUS

(71) Applicant: BSH Hausgeräte GmbH, Munich (DE)

(72) Inventor: Florian Schmid, Wenzenbach (DE)

(73) Assignee: BSH Hausgeräte GmbH, Munich (DE)

( * ) Notice: Subject to any disclaimer, the term of this patent is extended or adjusted under 35 U.S.C. 154(b) by 161 days.

(21) Appl. No.: 18/322,137

(22) Filed: May 23, 2023

(65) Prior Publication Data

US 2023/0375601 A1    Nov. 23, 2023

(30) Foreign Application Priority Data

May 23, 2022    (DE) ...................... 10 2022 205 116.5

(51) Int. Cl.
*G01R 19/165*    (2006.01)
*G01R 1/04*    (2006.01)
(Continued)

(52) U.S. Cl.
CPC ..... *G01R 19/16547* (2013.01); *G01R 1/0416* (2013.01); *G01R 1/203* (2013.01);
(Continued)

(58) Field of Classification Search
CPC .............. G01R 19/16547; G01R 1/203; G01R 19/175; G01R 19/2503; G01R 31/005;
(Continued)

(56) References Cited

U.S. PATENT DOCUMENTS 5,211,037 A       5/1993  Adamski et al.
2020/0292583 A1*  9/2020  Suchoff .............. G01R 19/0084

FOREIGN PATENT DOCUMENTS

CN    108802446 A     11/2018
DE    102005030634 A1  1/2007
(Continued)

OTHER PUBLICATIONS

Horowitz, Hill: The Art of Electronics. Third Edition. New York, USA: Cambridge University Press, 2015. pp. 348, 349, 353, 356, 357 , ISBN 978-0-521-80926-9—Published in English.
(Continued)

*Primary Examiner* — Daryl C Pope
(74) *Attorney, Agent, or Firm* — Laurence A. Greenberg; Werner H. Stemer; Ralph E. Locher

(57) ABSTRACT

A measuring apparatus ascertains measurement information relating to an input voltage. The measuring apparatus contains an operational amplifier having first and second inputs, and an output for providing the measurement information. The measuring apparatus further has a first input node for coupling to a first pole of the input voltage, and a first isolation resistor which connects the first input node to the first input of the operational amplifier. Moreover, the measuring apparatus contains a second input node for coupling to a second pole of the input voltage, and a second isolation resistor which connects the second input node to the second input of the operational amplifier. The measuring apparatus further has a feedback resistor which connects the output of the operational amplifier to the first input of the operational amplifier, and a reference resistor which connects the second input of the operational amplifier to a reference potential.

15 Claims, 5 Drawing Sheets

(51) Int. Cl.
   *G01R 1/20*      (2006.01)
   *G01R 19/175*    (2006.01)
   *G01R 19/25*     (2006.01)
   *G01R 31/00*     (2006.01)

(52) U.S. Cl.
   CPC ....... *G01R 19/175* (2013.01); *G01R 19/2503* (2013.01); *G01R 31/005* (2013.01)

(58) Field of Classification Search
   CPC ............ G01R 1/04161; G01R 19/0084; G01R 15/144; H03F 2200/261; H03F 2203/45526; H03F 3/45475; H03F 2203/45586; H03F 2203/45594; H03F 2203/45604
   See application file for complete search history.

(56) References Cited

FOREIGN PATENT DOCUMENTS

| DE | 102010028569 | * | 5/2010 | ......... A47L 15/0049 |
|----|---|---|---|---|
| DE | 102010028569 A1 | | 11/2011 | |
| JP | 2009290486 | * | 5/2008 | |

OTHER PUBLICATIONS

Tietze, Schenk:Electronic Circuits, Heidelberg, Springer, 2008 pp. 727, 728, 1034, 1035, ISBN 978-3-540-78655-9 (eBook)—DOI 10.1007/978-3-540-78655—Published in English.

* cited by examiner

MEASURING APPARATUS FOR MEASURING A VOLTAGE OVER AN ISOLATION BARRIER AND HOUSEHOLD APPLIANCE HAVING THE MEAURING APPARATUS

CROSS-REFERENCE TO RELATED APPLICATION

This application claims the priority, under 35 U.S.C. § 119, of German Patent Application DE 10 2022 205 116.5, filed May 23, 2022; the prior application is herewith incorporated by reference in its entirety.

FIELD AND BACKGROUND OF THE INVENTION

The invention relates to an apparatus, in particular a switching arrangement, for measuring a voltage, in particular an AC voltage or a DC voltage (e.g. the intermediate circuit voltage of a switched-mode power supply or of motor electronics).

A household appliance, such as, e.g., a washing machine or a dishwasher, typically has a grid connection, in particular a switched-mode power supply, with which the household appliance can be connected to an AC supply grid. The grid voltage or supply voltage provided by a supply grid can have fluctuations with regard to the voltage amplitude and/or with regard to the frequency. Such fluctuations can lead to overvoltage situations and/or to fluctuations in the power consumption in a household appliance and therefore possibly to impairments of the operation of the household appliance.

SUMMARY OF THE INVENTION

The present application is concerned with the technical object of enabling efficient and precise measurement of the grid voltage or supply voltage of an electrical appliance, in particular of a household appliance, in order to ensure reliable and stable operation of the electrical appliance even in the event of fluctuations in the supply voltage. In this case, the measurement should also be made possible over an isolation barrier.

The object is achieved by the subject matter of the independent patent claim. Advantageous embodiments are in particular defined in the dependent patent claims, described in the following description or illustrated in the appended drawing.

According to one aspect of the invention, a measuring apparatus for ascertaining measurement information relating to an input voltage, in particular relating to an alternating current (AC) input voltage or relating to a direct current (DC) input voltage, is described. The measuring apparatus can in particular be configured to provide one or more measurement voltages for the input voltage which can be read by a microprocessor (via an analog-to-digital converter) in a reliable and efficient manner in a Safety Extra Low Voltage (SELV) or a Protective Extra Low Voltage (PELV) environment. The input voltage, in particular the AC input voltage, can be, e.g., a 230 volt (V) supply voltage.

The measuring apparatus contains an operational amplifier having a first input (e.g. having an inverting and/or minus input) and having a second input (e.g. having a non-inverting and/or plus input), and having an output for providing the measurement information. The operational amplifier (and the optional comparator described in this document) can be operated, e.g., between an operating voltage (e.g. 10V or less, or 5V or less) and a reference voltage or a reference potential (e.g. ground). Alternatively, the operational amplifier (and optionally the comparator) can be operated between a positive and a negative operating voltage (which encompasses the reference potential). In a further example, the operational amplifier (and optionally the comparator) can be operated between two voltages which form a voltage range which comprises the subrange between the operating voltage and the reference potential (or another target range for the output voltage of the operational amplifier (or of the comparator)).

In addition, the measuring apparatus contains a first input node for coupling to a first pole (e.g. to the minus pole, to a phase conductor or to the neutral conductor) of the input voltage, and a first (ohmic) isolation resistor which connects the first input node (directly) to the first input of the operational amplifier. Moreover, the measuring apparatus contains a second input node for coupling to a second pole (in a complementary manner to the first pole e.g. to the plus pole, to the neutral conductor or to the phase conductor) of the input voltage, and a second (ohmic) isolation resistor which connects the second input node (directly) to the second input of the operational amplifier.

The input voltage can be part of a first voltage reference system. The input voltage can have, e.g., an amplitude of 100V or more. The first voltage reference system can be, e.g., a supply voltage (e.g. a 230V supply voltage) or an intermediate circuit voltage (for instance of a switched-mode power supply or of electronics for a BLDC motor, i.e. for a brushless DC motor). Conversely, the operating voltage and/or the reference potential can be part of a second voltage reference system, in particular of an SELV or of a PELV voltage reference system. The measurement information and/or the operating voltage can have, e.g., an amplitude of 50V or less. An isolation barrier can be arranged between the two voltage reference systems, which isolation barrier is provided in particular by the isolation resistors of the measuring apparatus. A measurement of the input voltage from another voltage reference range can therefore be made possible (at the output of the operational amplifier) in an efficient and reliable manner.

The measuring apparatus further contains a feedback resistor which connects the output of the operational amplifier (directly) to the first input of the operational amplifier. In addition, the measuring apparatus contains a reference resistor which connects the second input of the operational amplifier (directly or via an offset unit) to the reference potential (e.g. to ground). Measurement information relating to the input voltage can thus be provided at the output of the operational amplifier in a particularly precise way.

The first isolation resistor and the second isolation resistor can each have such a high resistance value that the first isolation resistor and the second isolation resistor achieve galvanic isolation with a leakage current which is less than a predefined (within a regulation, for instance the SELV standard) leakage current threshold value. Alternatively or in addition, the first isolation resistor and/or the second isolation resistor can each have a plurality of resistor elements arranged in series. An isolation barrier between the first voltage reference range and the second voltage reference range can thus be provided in a particularly efficient manner.

The resistance values of the first isolation resistor and of the second isolation resistor are preferably identical or deviate from one another by no more than 5%. Furthermore, the resistance values of the feedback resistor and of the reference resistor are preferably identical or deviate from one another by no more than 5%. Particularly precise and efficient measurement of the input voltage can thus be made possible via the output voltage at the output of the operational amplifier.

The measuring apparatus can comprise an offset unit (e.g. a voltage source) which is configured to shift the reference potential by an offset voltage in order to generate a modified reference potential. The reference resistor can then be arranged in such a way that the reference resistor connects the second input of the operational amplifier (directly) to the modified reference potential.

The input voltage can have different polarities at different times. The input voltage can be, e.g., an AC voltage. The offset voltage can be so high that the differential voltage between the first input and the second input of the operational amplifier has a uniform polarity at each of the different times (preferably between 0V and the operating voltage). Alternatively or in addition, the offset voltage can be so high that the output voltage at the output of the operational amplifier has a uniform polarity at each of the different times (preferably between 0V and the operating voltage).

The output voltage at the output of the operational amplifier can be configured to assume values from a possible voltage range, and/or measuring and/or evaluation electronics downstream of the operational amplifier can be configured to measure measurement values from the possible voltage range. The offset voltage can then correspond to half of the possible voltage range. In a preferred example, the offset voltage corresponds to half of the voltage difference between the operating voltage and the reference potential, or deviates by no more than 5% therefrom. In this case, the output voltage can be measured between the output of the operational amplifier and the reference potential (e.g. ground) (and passed to an analog-to-digital converter).

Provision can therefore be made for an offset unit which makes it possible to provide, at the output of the operational amplifier, an output voltage (relative to the reference potential) which has no change in polarity, even when measuring an AC input voltage. Particularly efficient and precise measurement of the input voltage can thus be made possible.

The measuring apparatus can therefore be designed to provide, as measurement information at the output of the operational amplifier, an output voltage as a measurement of the input voltage, which output voltage corresponds to a scaled and/or shifted version of the input voltage. In this case, the output voltage can have an amplitude of 50V or less (even if the input voltage has an amplitude of 100V or more). Particularly efficient measurement of the input voltage can therefore be made possible.

The measuring apparatus can comprise a comparator which is configured to compare the output voltage at the output of the operational amplifier with a comparison potential derived from the reference potential. In this case, the comparison potential can be the modified reference potential which corresponds to the reference potential shifted by the offset voltage. The comparator can therefore be configured to indicate a change in polarity and/or a zero crossing of the input voltage as an output signal of the comparator. Providing a comparator can allow efficient and precise measurement of the zero crossing and/or of the frequency of an (AC) input voltage.

The measuring apparatus can comprise an analog-to-digital converter which is configured to convert the output voltage at the output of the operational amplifier or a voltage derived therefrom (e.g. the output voltage or the output signal of the comparator) into a digital measurement voltage.

In addition, the measuring apparatus can contain a processor which is configured to use the digital measurement voltage as a basis for ascertaining, as measurement information, a measurement value for the input voltage, in particular a measurement value for the amplitude or for the entire signal form of the input voltage. Alternatively or in addition, a change in polarity and/or a zero crossing of the input voltage can be detected, and/or the frequency of the input voltage can be ascertained (if the digital measurement voltage indicates the output signal of the comparator). Efficient and precise use of the measurement information can therefore be made possible.

According to a further aspect, a household appliance (e.g. a washing machine, a dishwasher, an oven, a stove, a kitchen appliance, a vacuum cleaner, a dryer, a refrigerator, etc.) which includes the measuring apparatus described in this document is described. The household appliance can in particular contain a grid connection for connecting the household appliance to an AC supply voltage. The measuring apparatus can be configured to use the AC supply voltage as a basis for ascertaining measurement information relating to the supply voltage.

The household appliance can further comprise a control unit which is configured to operate a function of the household appliance depending on the measurement information, in particular depending on a measurement value of the amplitude of the supply voltage. For example, the power of the household appliance can be controlled or regulated depending on the measurement information. Particularly safe and reliable operation of the household appliance can thus be made possible.

It should be noted that any aspects of the measuring apparatus described in this document can be combined with one another in a variety of ways. In particular, the features of the patent claims can be combined with one another in a variety of ways.

Other features which are considered as characteristic for the invention are set forth in the appended claims.

Although the invention is illustrated and described herein as embodied in a measuring apparatus for measuring a voltage over an isolation barrier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
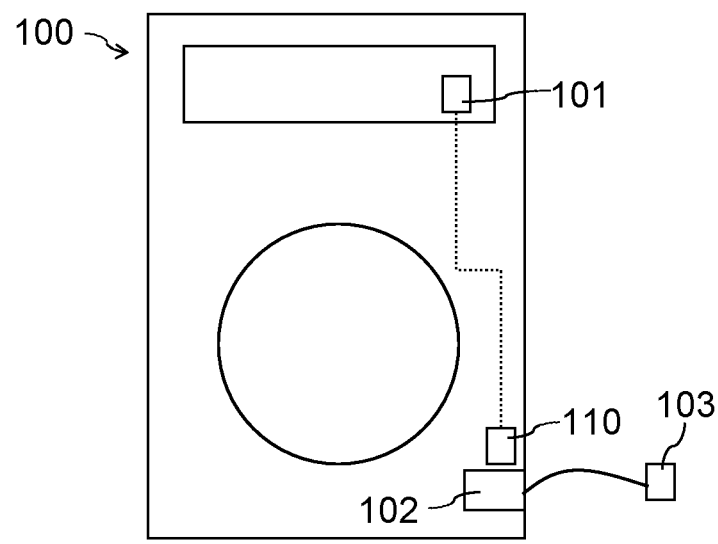
FIG. 1 is a block diagram of an exemplary household appliance.

As stated above, the present document is concerned with enabling stable and reliable operation of a household appliance in an efficient manner even in the event of fluctuations in the supply voltage. Referring now to the figures of the drawings in detail and first, particularly to FIG. 1 thereof, there is shown an exemplary household appliance 100, e.g. a washing machine, having a grid connection 102, in particular having a switched-mode power supply, via which the household appliance 100 can be connected to an AC supply voltage 103. The household appliance 100 contains a measuring apparatus 110 which is configured to measure one or more measurement signals relating to the supply voltage 103. The one or more measurement signals (e.g. the output voltage of an operational amplifier and/or the output signal of a comparator) can be evaluated by a control unit 101, e.g. by a microprocessor, of the household appliance 100, in particular in order to match the operation of the household appliance 100 to a respectively present characteristic, e.g. amplitude and/or frequency, of the supply voltage or grid voltage 103. Stable and reliable operation of the household appliance 100 can thus be enabled even in the event of fluctuations in the supply voltage 103.

FIG. 1 therefore shows a household appliance 100 which can be connected to the public electricity grid via a power plug and can thus be supplied with electrical energy. The public electricity grid can be considered to be "voltage reference system A". Live parts in and on the household appliance 100 which have a connection to this voltage reference system typically have to be electrically isolated and protected from being touched by a user of the household appliance 100. Electric shocks caused by the relatively high voltage of this voltage reference system can thus be avoided in a reliable manner. Such isolation is potentially not possible or associated with relatively high complexity in a household appliance 100, for example in the region of the user interface, or in the case of accessories such as a meat thermometer, for example.

For this reason, a household appliance 100 typically has its own power supply, which can be referred to as "voltage reference system B" and which has a lower (operating) voltage (also referred to as VDD in this document) with respect to the grid voltage 103, by way of which electric shocks for a user can be reliably avoided. Components of the household appliance 100 which cannot be isolated can be safely supplied with electrical energy within the voltage reference system B.

One pole of the public electricity grid is typically connected to ground, which makes it necessary to galvanically isolate the voltage reference system A and the voltage reference system B from one another. The galvanic separation can be achieved by a so-called isolation barrier. Energy can be transmitted between the two voltage reference systems magnetically by means of a transformer (as part of the isolation barrier).

An isolation barrier usually has a maximum permissible discharge current (which is also referred to as leakage current) and/or one or more further isolation characteristics, such as, e.g., a particular geometrical spacing and/or a particular dielectric strength. The electrically defined relationship of the two voltage reference systems, which are galvanically separated from one another by the isolation barrier, with respect to one another is usually lost through an isolation barrier. If the voltage of the voltage reference system A is intended to be measured within the voltage reference system B, it is therefore typically necessary to transmit this relative voltage information to the voltage reference system B without deactivating the isolation barrier in this case.

An example of a voltage measurement over an isolation barrier is the measurement of the grid voltage 103. Measured information relating to the grid voltage 103 can, e.g., be used to activate a protective function in the household appliance 100 or to optimize, in terms of energy, one or more processes, such as, for example, the defrosting of a refrigerator by means of heaters.

In this document, a measuring apparatus 110 for measuring a voltage 103 over an isolation barrier is described, which measuring apparatus satisfies a maximum permissible leakage current stipulated for the isolation barrier and/or satisfies one or more further isolation characteristics or isolation requirements.

Figure 2:
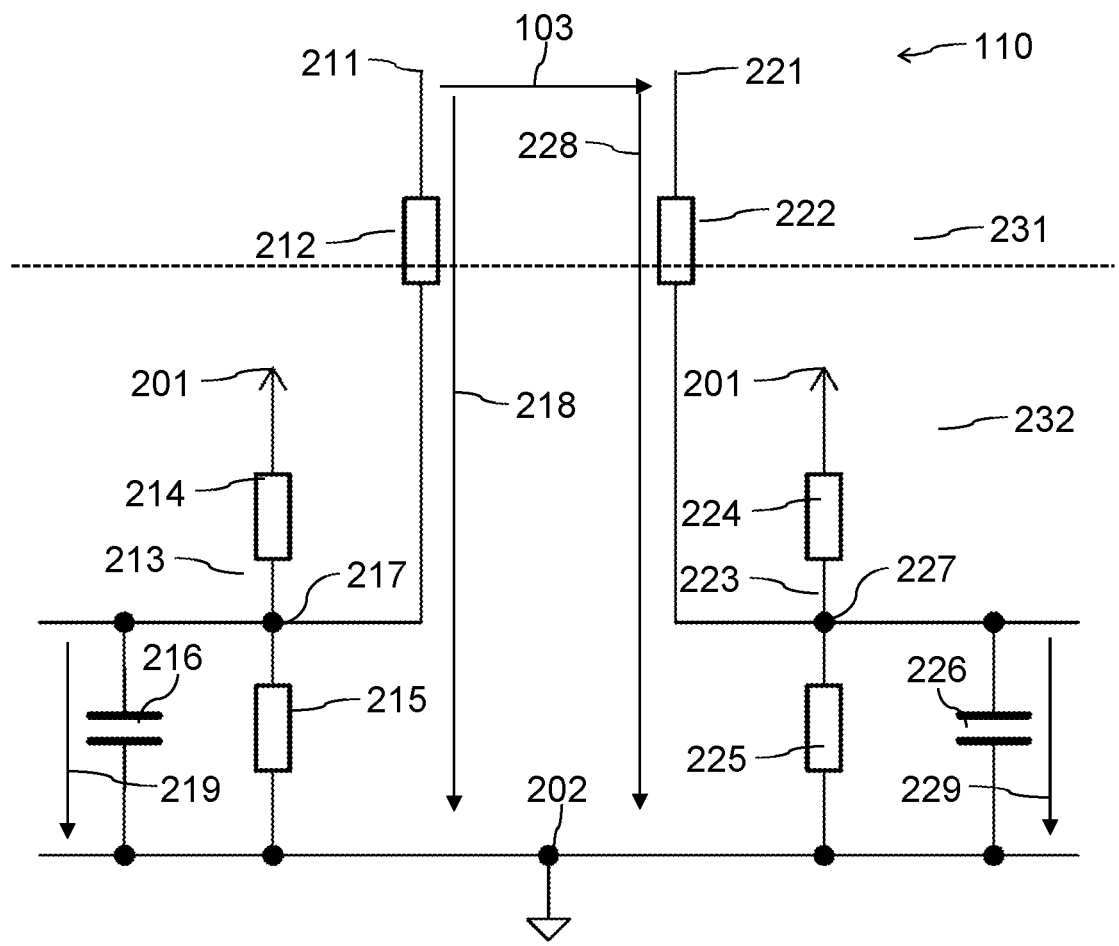
FIG. 2 is block diagram of an exemplary measuring apparatus for measuring a voltage.

FIG. 2 shows a circuit diagram of an exemplary measuring apparatus 110. The measuring apparatus 110 is configured to clearly determine the potential difference 103 between the points 211 and 221 (i.e. the input voltage 103) using the difference between the measurement voltages 219 (between the first measurement point 217 and the reference potential 202) and 229 (between the second measurement point 227 and the reference potential 202).

The offset resistors 214 and 224 establish a connection of the measurement points 217 and 227 to the operating voltage 201 of the second voltage reference system B 232. The operating voltage 201 can have a fixed value in relation to the reference potential 202. An offset voltage can thus be added to each of the measurement voltages 219 and 229, which offset voltage makes it possible to keep each of the measurement voltages 219, 229 solely in the positive range. This is advantageous for receiving each of the individual measurement voltages 219, 229 via a unipolar analog-to-digital converter in a microprocessor.

The resistors 212, 214 and 215 and the resistors 222, 224 and 225 each form a voltage divider 213, 223 between the voltage 218 and the first measurement voltage 219 and between the voltage 228 and the second measurement voltage 229, respectively.

The potential difference between the input nodes 211 and 221 constitutes the input voltage 103. In this case, the potential differences or voltages 218 and 228 are typically not significant in absolute terms. Interference, common-mode voltages or additional impedances between the input nodes 211 and 221 and the reference potential 202 cancel each other out when the difference is formed and only the input voltage 103 remains as the result. It is thus possible, in a system in which one point is set as potential reference point ("GND") (with the reference potential 202), to measure a voltage between two input nodes 211, 221 independently of the respective absolute potential differences 218, 228 of the individual input nodes 211, 221 in relation to the potential reference point of the system. A high-impedance connection of the two input nodes 211, 221 to the measuring apparatus 110 is thus made possible.

The capacitors 216 and 226 can be used for the low-pass filtering of the measurement voltage. If no low-pass filtering is required, the capacitors 216, 226 can be dispensed with.

By using relatively high resistance values of the isolation resistors 212 and 222 and by way of a corresponding limitation of the electrical currents via the isolation resistors 212, 222, a voltage measurement over an isolation barrier between the first voltage reference system A 231 and the second voltage reference system B 232 is made possible.

Typically, the higher the chosen resistance value of the isolation resistors 212 and 222, the greater the interference influence of parasitic capacitances on the absolute voltages 218 and 228. By way of the differential voltage measurement, however, these interference influences completely cancel each other out as part of the difference formation such that precise measurement of the input voltage 103 using the difference of the measurement voltages 219, 229 is made possible even when reducing the leakage currents of the isolation barrier by increasing the resistance value of the isolation resistors 212 and 222. In this case, the measuring apparatus 110 illustrated in FIG. 2 uses only passive components and therefore allows particularly efficient implementation.

In the case of the measuring apparatus 110 illustrated in FIG. 2, the two measurement voltages 219, 229 have to be measured virtually at the same time, which typically requires the use of at least two analog-to-digital converter inputs and sampling of the two inputs at times which are as close together as possible. If a sufficient number of analog-to-digital converter inputs are unavailable and/or if virtually simultaneous sampling is not possible, the measuring apparatus 110 from FIG. 2 can thus typically not be used.

Figure 3A:
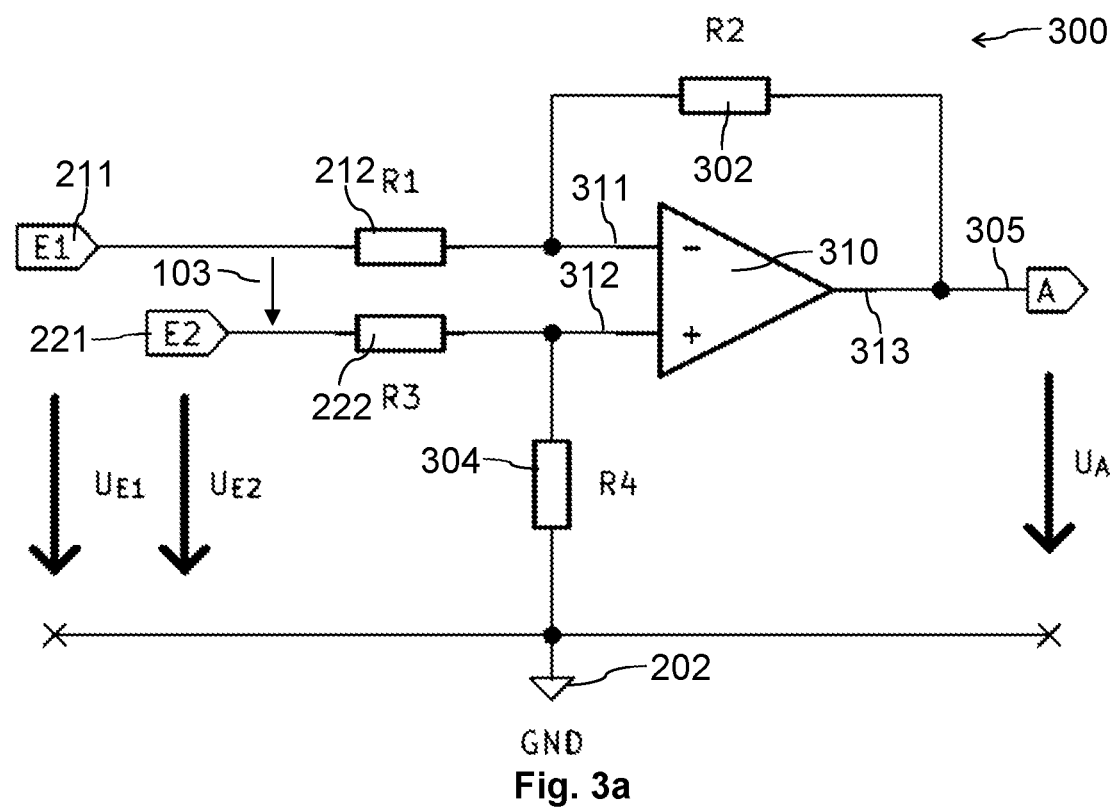
FIG. 3A is a basic circuit diagram based on an operational amplifier.

FIG. 3A shows an exemplary operational amplifier basic circuit 300 having the function of a subtracter. The circuit 300 is configured to subtract the two input voltages "$U_{E2}$" 221 and "$U_{E1}$" 211 from one another, and delivers, based thereon, a result as output voltage "$U_A$" at the output node 305 (relative to the reference potential 202). The two input voltages 211, 221 are routed via resistors 212, 222 to the inverting input 311 and to the non-inverting input 312, respectively, of an operational amplifier 310. The output 313 of the operational amplifier 310 is coupled to the inverting input 311 via a feedback resistor 302. The non-inverting input 312 is coupled to the reference potential 202 via a reference resistor 304.

For an ideal operational amplifier 310, the relationship between the output voltage and the input voltages 211, 221 can be described as $$U_A = U_{E2} * \frac{R1+R2}{R1} * \frac{R4}{R3+R4} - U_{E1} * \frac{R2}{R1}. \quad (a)$$

By setting the following conditions for the resistance values of the resistors 212, 222, 302, 304: R1=R3 and R2=R4, the relationship can be illustrated by the following formula:

$$U_A = \frac{R2}{R1} * (U_{E2} - U_{E1}). \quad (a)$$

As can be seen from this formula, a voltage measurement between the points "E1" and "E2" can be made possible by means of the circuit 300. The absolute voltages between the points "E1" 211 and "E2" 221 to the point "GND" (with the reference potential 202) no longer play a role in this case. Only the potential difference 103 between the points "E1" 211 and "E2" 221 is evaluated.

Figure 3B:
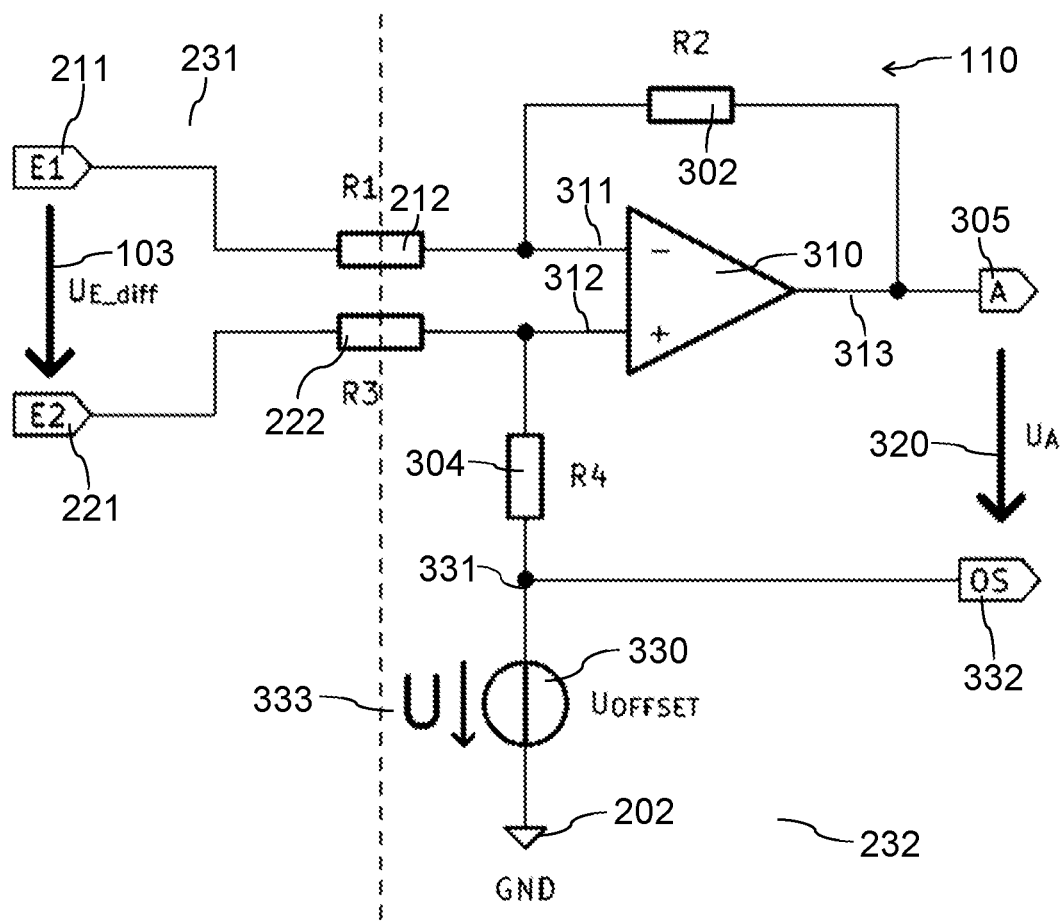
FIG. 3B is a circuit diagram of the exemplary measuring apparatus having the operational amplifier.

The circuit principle from FIG. 3A can be used to measure a voltage over an isolation barrier in a household appliance 100, such as illustrated by way of example in FIG. 3B. The values of the resistors "R1" and "R3" and also "R2" and "R4" are preferably identical in order to eliminate the absolute voltage reference between the two voltage reference systems "A" 231 and "B" 232. As a consequence thereof, still only the potential difference 103 between the points "E1" 211 and "E2" 221 is relevant.

In the electronic circuits 102 installed in a household appliance 100, usually only a positive operating voltage 201 is available (for operating the operational amplifier 310). Furthermore, an analog-to-digital converter usually carries out a voltage measurement only in the positive voltage range. For this reason, the measuring apparatus 110 can comprise an offset unit 330 (e.g. an (ideal) voltage source) which is configured to effect an offset voltage 333, by way of which an output voltage 340 which lies solely in the positive range in relation to the reference potential 202 is achieved at the output point 305 (see FIG. 3C). By subtracting the offset voltage 333 from this output voltage 340, a measurement value 320 which can be positive and negative and can therefore represent both polarities of the voltage 103 that is to be measured is therefore obtained (see FIG. 3B), e.g. in order to detect the zero crossing of the voltage 103 that is to be measured. In order to allow the greatest possible modulation in both voltage directions, the offset voltage 333 preferably corresponds to half the voltage of the entire measurement range (which typically corresponds to the difference between the operating voltage 201 and the reference potential 202). In the case of a measurement range of 0V to 3.3V, e.g. an offset voltage "$U_{OFFSET}$" 333 of approximately 1.65V can be chosen. Generally, half the supply voltage or operating voltage 201 can be used as the offset voltage 333. The offset unit 330 can be arranged between the reference potential 202 and the reference resistor 304 such that a modified reference potential 332, which corresponds to the reference potential 202 shifted by the offset voltage 333, can be provided at the connection point 331 between the reference resistor 304 and the offset unit 330. The output voltage 320 can be provided relative to the modified reference potential 332.

The isolation resistors "R1" 212 and "R3" 222 constitute the resistors which reach over the isolation barrier between the voltage reference systems 231, 232. These resistors are preferably designed in such a way that the isolation resistors 212, 222 do not impair the characteristics of the isolation between the voltage reference systems "A" 231 and "B" 232. For this purpose, the resistance values of the isolation resistors 212, 222 typically do not fall below a known minimum resistance value. Alternatively or in addition, the isolation resistors 212, 222 preferably comply with a known standard and/or each consist of a plurality of resistor elements connected in series.

The differential measurement principle of the measuring apparatus 110 allows virtually any resistance value of "R1" 212 and "R3" 222 to be chosen. The two voltage reference systems "A" 231 and "B" 232 can therefore be separated from one another at very high impedance such that isolation therebetween is not impaired. The output voltage "$U_A$" 320 of the measuring apparatus 110 from FIG. 3B can be ascertained by the following formula:

$$U_A = \frac{R2}{R1} * (-U_{E\_diff}).$$

Figure 3C:
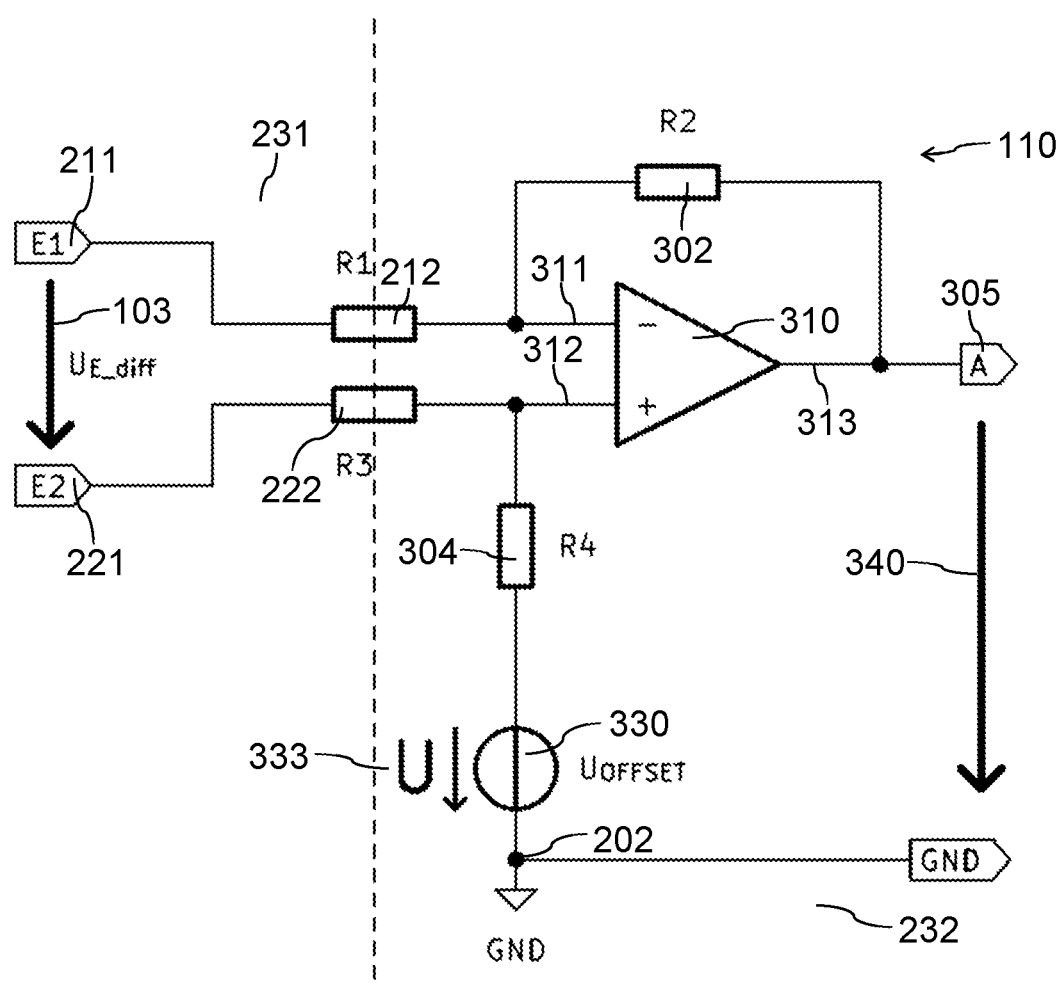
FIG. 3C is a circuit diagram of a further exemplary measuring apparatus having the operational amplifier.

FIGS. 3B and 3C show no components for filtering the measurement signal (i.e. the output voltage 320) and/or for protecting the circuitry but these components can be added as required (without changing the basic functionality of the circuit 110 and the measurement of voltages over an isolation barrier).

Figure 4A:
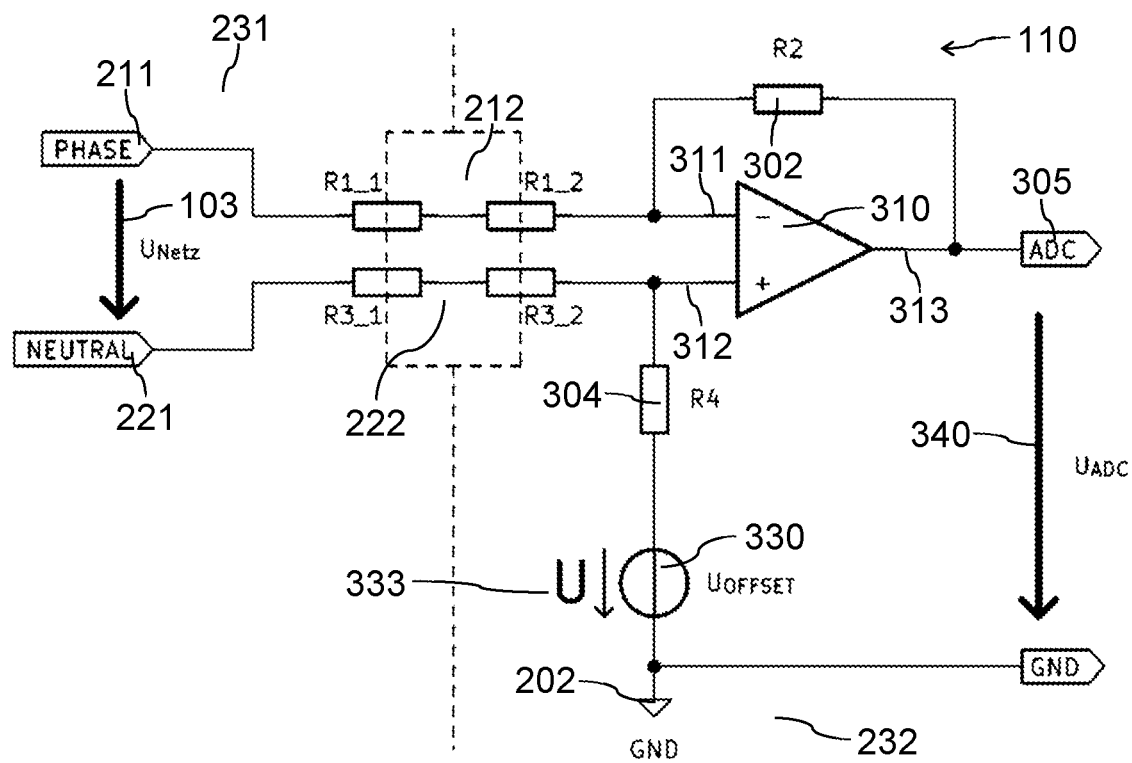
FIG. 4A is a circuit diagram of the exemplary measuring apparatus for measuring the amplitude of an AC input voltage.

FIG. 4A illustrates the application of the measuring apparatus 110 for measuring the grid voltage in a household appliance 100. The terminals "E1" 211 and "E2" 221 can be connected to the two terminals "PHASE" and "NEUTRAL" of the electricity supply grid. For safety reasons, the isolation resistors "R1" and "R3" 212, 222 can each be implemented by two resistors connected in series ("R1" comprising "R1_1" and "R1_2", and "R3" comprising "R3_1" and "R3_2"). The resistance value should be chosen to be high enough to maintain the isolation barrier. The output voltage "$U_{ADC}$" 340 at the point "ADC" 305 (relative to the reference potential 202) constitutes the divided, measured grid voltage provided with an offset "$U_{OFFSET}$" 333. The zero point is located at the voltage value "$U_{OFFSET}$". It is therefore possible to measure both polarities of the input voltage, in this case of the grid voltage, without having to measure a negative voltage with an analog-to-digital converter (ADC). The grid voltage "$U_{Netz}$" can be calculated from the measured voltage "$U_{ADC}$" 340 using the following formula:

$$U_{Net} = \frac{R1}{R2} * (U_{OFFSET} - U_{ADC}).$$

Figure 4B:
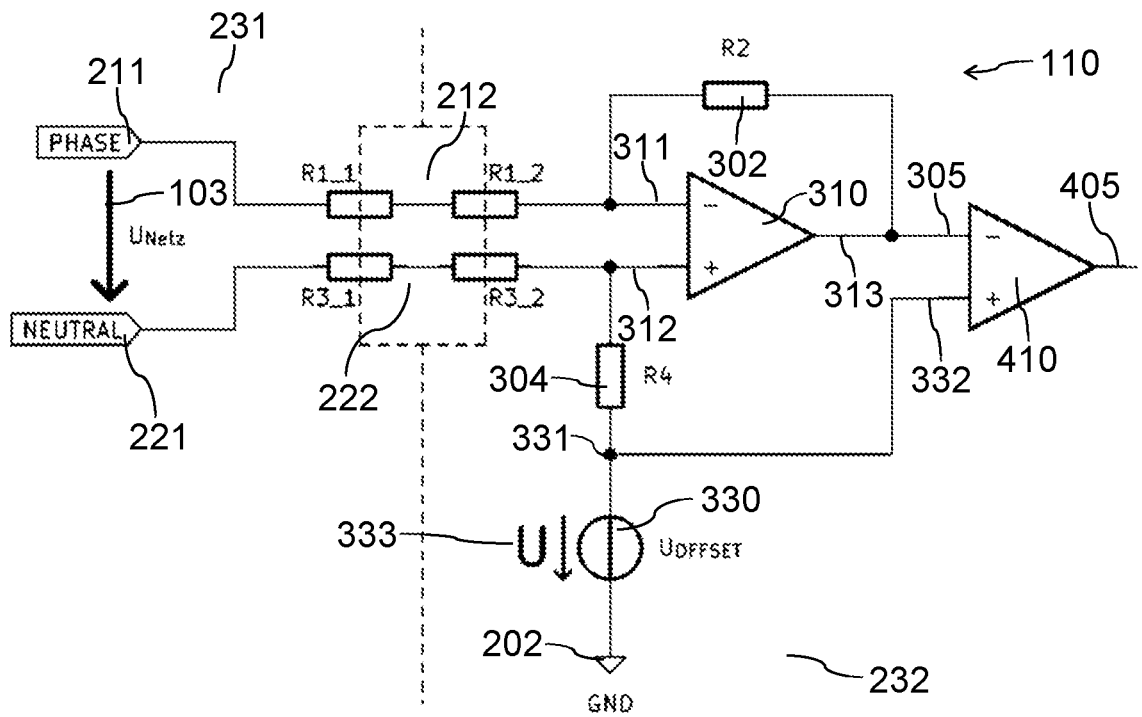
FIG. 4B is a circuit diagram of an exemplary measuring apparatus for measuring the zero crossing and/or the frequency of an AC input voltage.

A further application is the detection of the zero crossing of the grid voltage, such as illustrated by way of example in FIG. 4B. The detection of the zero crossing can be used, for example, for the grid-voltage-synchronous switching of actuators in a household appliance 100. The measurement of the grid frequency as clock is a further application of such a zero-crossing detection.

In order to detect a zero crossing, the polarity of the output voltage "$U_A$" of the operational amplifier 310 can be evaluated. A comparator 410 can be used for this purpose. The comparator 410 converts the polarity of the signal into a digital signal having the two states high and low. This output signal of the comparator 410 can then be tapped at the output point 405 of the comparator 410. The state of the signal at the output point 405 therefore indicates the respectively present polarity of the grid voltage. A change in the state of the signal at the output point 405 therefore corresponds to a zero crossing of the grid voltage "$U_{Netz}$".

The measuring apparatus 110 described in this document has a relatively low component expenditure and space requirement. Furthermore, it is sufficient to measure a single voltage and so only one single analog-to-digital converter input is required. In addition, the output impedance of the circuit 110 is relatively low on account of the operational amplifier 310, which allows relatively fast sampling of the measured voltage. The measuring apparatus 110 allows grid voltage measurement and/or zero-crossing detection in appliances 100 in which no grid-potential-related measurement circuit is provided or possible.

The measuring apparatus 110 primarily has passive components in the form of resistors such that interference influences can be effectively calculated and compensated for by component tolerances. In a first approximation, the components have linear behavior, which allows simple calibration of the circuit 110 during the manufacturing process.

The present invention is not limited to the exemplary embodiments shown. In particular, it should be noted that the description and the figures are only intended to illustrate the principle of the proposed measuring apparatus.

The invention claimed is:

1. A household appliance, comprising:
a grid connection for connecting the household appliance to an AC supply voltage;
a measuring apparatus for ascertaining measurement information relating to an input voltage, said measuring apparatus including:
an operational amplifier having a first input, a second input, and an output for providing the measurement information;
a first input node for coupling to a first pole of the input voltage;
a first isolation resistor connecting said first input node to said first input of said operational amplifier;
a second input node for coupling to a second pole of the input voltage;
a second isolation resistor connecting said second input node to said second input of said operational amplifier;
a feedback resistor connecting said output of said operational amplifier to said first input of said operational amplifier;
a reference resistor connecting said second input of said operational amplifier to a reference potential;
an analog-to-digital converter configured to convert an output voltage at said output of said operational amplifier or a voltage derived therefrom into a digital measurement voltage; and
a processor configured to use the digital measurement voltage as a basis for:
ascertaining, as the measurement information, a measurement value for the input voltage;
detecting a change in polarity and/or a zero crossing of the input voltage; and/or
ascertaining a frequency of the input voltage;
said measuring apparatus configured to use the AC supply voltage as a basis for ascertaining the measurement information relating to the AC supply voltage; and
a controller configured to operate a function of the household appliance depending on the measurement information.

2. The measuring apparatus household appliance according to claim 1, wherein said first isolation resistor and said second isolation resistor each have a resistance value such that said first isolation resistor and said second isolation resistor achieve galvanic isolation with a leakage current which is less than a predefined leakage current threshold value.

3. The household appliance according to claim 1, wherein:
the input voltage is part of a first voltage reference system; and/or
an operating voltage and/or the reference potential for operating said operational amplifier are part of a second voltage reference system.

4. The household appliance according to claim 1, wherein said first isolation resistor and/or said second isolation resistor each have a plurality of resistor elements disposed in series.

5. The household appliance according to claim 1, wherein:
resistance values of said first isolation resistor and of said second isolation resistor being identical or deviating from one another by no more than 5%; and/or
resistance values of said feedback resistor and of said reference resistor being identical or deviating from one another by no more than 5%.

6. The household appliance according to claim 1,
further comprising an offset unit configured to shift the reference potential by an offset voltage to generate a modified reference potential; and
wherein said reference resistor connecting said second input of said operational amplifier to the modified reference potential.

7. The household appliance according to claim 6, wherein:
the input voltage has different polarities at different times; and
the offset voltage is so high that:
a differential voltage between said first input and said second input of said operational amplifier has a uniform polarity at each of the different times; and/or
an output voltage at said output of said operational amplifier has a uniform polarity at each of the different times.

8. The household appliance according to claim 6, wherein:
said operational amplifier is operated between an operating voltage and the reference potential; and
the offset voltage corresponds to half of a voltage difference between the operating voltage and the reference potential, or deviating by no more than 5% therefrom.

9. The household appliance according to claim 6, wherein:
an output voltage at said output of said operational amplifier assuming values from a possible voltage range, and/or from measuring and/or from evaluation electronics downstream of said operational amplifier and configured to measure measurement values from the possible voltage range; and
the offset voltage corresponding to half of the possible voltage range.

10. The household appliance according to claim 1, wherein:
the measuring apparatus is configured to provide, as the measurement information at said output of said operational amplifier, an output voltage as a measurement of the input voltage; and
the output voltage corresponding to a scaled and/or shifted version of the input voltage.

11. The household appliance according to claim 10, wherein:
the input voltage has an amplitude of at least 100V; and
the output voltage has an amplitude of 50V or less.

12. The household appliance according to claim 1, further comprising a comparator configured to compare an output voltage at said output of said operational amplifier with a comparison potential derived from the reference potential.

13. The household appliance according to claim 12, wherein:
said comparator is configured to indicate a change in polarity and/or a zero crossing of the input voltage as an output signal of said comparator;
said operational amplifier and said comparator are operated between an operating voltage and the reference potential or between a positive and a negative operating voltage; and
the comparison potential being a modified reference potential which corresponds to the reference potential shifted by an offset voltage.

14. The household appliance according to claim 3, wherein:
the first voltage reference system is an electricity supply grid or of an intermediate circuit of an electrical appliance; and/or
the second voltage reference system is a safety extra low voltage, or a protective extra low voltage of a voltage reference system.

15. The household appliance according to claim 1, wherein the digital measurement voltage is a basis for a measurement value for an amplitude or an entire signal form of the input voltage.

* * * * *